United States Patent
Seo et al.

(10) Patent No.: US 9,136,478 B2
(45) Date of Patent: Sep. 15, 2015

(54) ORGANIC LIGHT EMITTING DEVICE AND DISPLAY PANEL USING THE SAME METHOD, TERMINAL, AND SERVER FOR IMPLEMENTING FAST PLAYOUT

(71) Applicant: LG Display Co., Ltd., Seoul (KR)

(72) Inventors: Jeong-Dae Seo, Incheon (KR); Ki-Woog Song, Jeonbuk (KR)

(73) Assignee: LG Display Co., Ltd., Seoul (KR)

( * ) Notice: Subject to any disclaimer, the term of this patent is extended or adjusted under 35 U.S.C. 154(b) by 333 days.

(21) Appl. No.: 13/650,836

(22) Filed: Oct. 12, 2012

(65) Prior Publication Data
US 2013/0092910 A1    Apr. 18, 2013

(30) Foreign Application Priority Data

Oct. 14, 2011  (KR) .................. 10-2011-0105093
Oct. 10, 2012  (KR) .................. 10-2012-0112178

(51) Int. Cl.
*H01L 51/50* (2006.01)
*H01L 51/00* (2006.01)
*H01L 27/32* (2006.01)

(52) U.S. Cl.
CPC ........ *H01L 51/0052* (2013.01); *H01L 51/0059* (2013.01); *H01L 27/3244* (2013.01); *H01L 51/5088* (2013.01)

(58) Field of Classification Search
None
See application file for complete search history.

(56) References Cited

U.S. PATENT DOCUMENTS

| | | | | |
|---|---|---|---|---|
| 2005/0037234 A1* | 2/2005 | Kim et al. | | 428/690 |
| 2005/0084712 A1* | 4/2005 | Kido et al. | | 428/690 |
| 2006/0286403 A1* | 12/2006 | Lee | | 428/690 |
| 2007/0018569 A1* | 1/2007 | Kawamura et al. | | 313/504 |
| 2009/0117807 A1* | 5/2009 | Uno et al. | | 445/3 |
| 2012/0319572 A1* | 12/2012 | Lee et al. | | 313/512 |

FOREIGN PATENT DOCUMENTS

| CN | 101331111 A | 12/2008 |
|---|---|---|
| CN | 101399317 A | 4/2009 |
| CN | 101405255 A | 4/2009 |
| EP | 2287914 A1 | 2/2011 |
| JP | 2009010364 A | 1/2009 |
| WO | WO 2011/096506 A1 | 8/2011 |

OTHER PUBLICATIONS

Office Action and Search Report issued in Chinese Patent Application No. 201210385406.7, mailed Feb. 3, 2015, 30 pages.

* cited by examiner

*Primary Examiner* — Gregory Clark
(74) *Attorney, Agent, or Firm* — Brinks Gilson & Lione

(57) ABSTRACT

An organic light emitting device includes an anode, a hole injection layer, a hole transport layer, a light emitting layer, an electron transport layer, an electron injection layer and a cathode laminated in this order, wherein the hole injection layer comprises a mixture of an inorganic material comprising at the least of one of an alkali metal oxide, an alkaline earth metal oxide, a halogen compound of an alkali metal, a halogen compound of an alkaline earth metal, and an organic material comprising at least one of compounds represented by Formula 1:

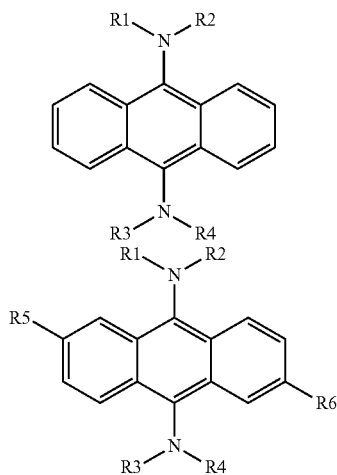 (1)
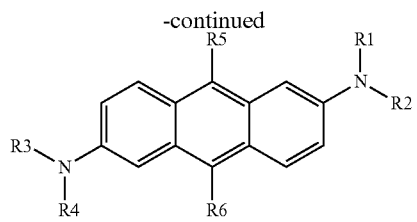
wherein R1, R2, R3, R4, R5 and R6 are each independently selected from a substituted or unsubstituted $C_6$ to $C_{30}$ aromatic group and a $C_5$ to $C_{29}$ heterocyclic group containing N, S, or O, wherein the substituent is selected from a $C_1$ to $C_6$ aliphatic group and a $C_6$ to $C_{12}$ aromatic group.
11 Claims, 6 Drawing Sheets

ORGANIC LIGHT EMITTING DEVICE AND DISPLAY PANEL USING THE SAME METHOD, TERMINAL, AND SERVER FOR IMPLEMENTING FAST PLAYOUT

This application claims the benefit of Korean Patent Application No. 10-2011-0105093 filed on Oct. 14, 2011, and No. 10-2012-0112178 filed on Oct. 10, 2012, which is hereby incorporated by reference as if fully set forth herein.

BACKGROUND

1. Field of the Disclosure

The present disclosure relates to an organic light emitting device and a display panel using the same. More specifically, the present disclosure relates to an organic light emitting device and a display panel using the same, to reduce a driving voltage.

2. Discussion of the Related Art

With recent trends toward large-area displays, there has been increased demand for flat display devices that take up little space. In particular, technology of organic electroluminescent (EL) devices (also called 'organic light emitting diodes (OLEDs)') as flat display devices has been rapidly developed. A variety of prototypes of organic electroluminescent (EL) devices have been reported to date.

When charge carriers are injected into an organic film formed between an electron injection electrode (cathode) and a hole injection electrode (anode) of an organic electroluminescent device, electrons combine with holes to create electron-hole pairs, which then decay to emit light. Organic electroluminescent devices have advantages in that they can be fabricated on flexible transparent substrates (e.g., plastic substrates) and can be operated at a voltage (e.g., 10V or below) lower than voltages required to operate plasma display panels (PDPs) and inorganic electroluminescent devices. Other advantages of organic electroluminescent devices are relatively low power consumption and excellent color representation. Further, since organic electroluminescent (EL) devices can emit light of three colors (i.e., green, blue and red), they have been the focus of intense interest lately as next-generation display devices capable of producing images of various colors. A general method for fabricating organic EL devices will be briefly explained below.

(1) First, a transparent substrate is covered with an anode material. Indium tin oxide (ITO) is generally used as the anode material.

(2) A hole injection layer (HIL) is formed to a thickness of 10 to 30 nm on the anode. Copper (II) phthalocyanine (CuPc) is mainly used as a material of the hole injection layer.

(3) A hole transport layer (HTL) is introduced into the resulting structure. The hole transport layer is formed by depositing 4,4'-bis[N-(1-naphthyl)-N-phenylamino]-biphenyl (NPB) to a thickness of about 30 to about 60 nm on the hole injection layer.

(4) An organic light-emitting layer is formed on the hole transport layer. If necessary, a dopant may be added to a material for the organic light-emitting layer. For green light emission, tris(8-hydroxyquinoline)aluminum ($Alq_3$) as a material for the organic light-emitting layer is deposited to a thickness of about 30 to about 60 nm on the hole transport layer, and N-methylquinacridone (MQD) is mainly used as the dopant.

(5) An electron transport layer (ETL) and an electron injection layer (EIL) are sequentially formed on the organic light-emitting layer. Alternatively, an electron injection/transport layer is formed on the organic light-emitting layer. In the case of green light emission, since $Alq_3$ has excellent electron-transport ability, the formation of the electron injection/transport layer may be unnecessary.

(6) A cathode material is coated on the electron injection layer, and finally a passivation film is covered thereon.

The type of the organic electroluminescent devices (i.e. blue, green and red light-emitting devices) will be determined depending on the kind of materials for the light-emitting layer.

Meanwhile, DNTPD, IDE406 and CuPc shown in FIG. 1 are used as materials for the hole injection layer. The materials for the hole injection layer disadvantageously cause an increase in driving voltage due to difficulty of injection of holes caused by difference in highest occupied molecular orbital (HOMO) energy level between the hole injection layer and the hole transport layer.

SUMMARY

An organic light emitting device includes an anode, a hole injection layer, a hole transport layer, a light emitting layer, an electron transport layer, an electron injection layer and a cathode laminated in this order, wherein the hole injection layer comprises a mixture of an inorganic material comprising at least one of an alkali metal oxide, an alkaline earth metal oxide, a halogen compound of an alkali metal, and a halogen compound of an alkaline earth metal, and an organic substance comprising at least one of compounds represented by Formula 1:

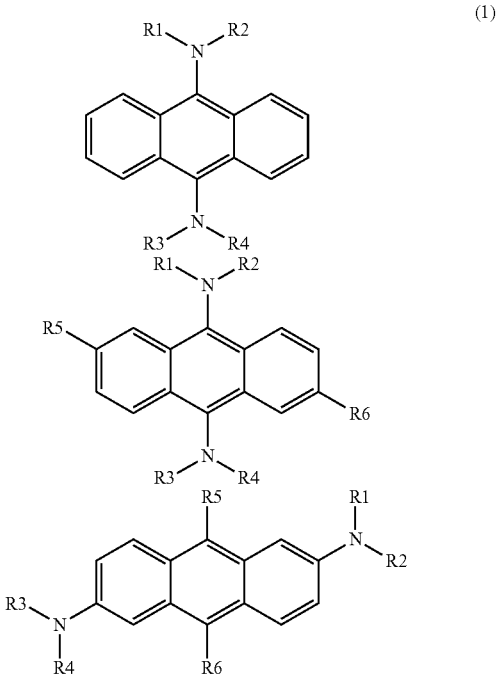

wherein R1, R2, R3, R4, R5 and R6 are each independently selected from a substituted or unsubstituted $C_6$ to $C_{30}$ aromatic group and a $C_5$ to $C_{29}$ heterocyclic group containing N, S, or O, wherein the substituent is selected from a $C_1$ to $C_6$ aliphatic group and a $C_6$ to $C_{12}$ aromatic group.

In accordance with another aspect of the present invention, provided is a display panel including: a driving thin film transistor formed on a substrate; a first electrode connected to the driving thin film transistor; a bank insulating film provided with a bank hole to expose the first electrode; an organic common layer formed in the bank hole, the organic common layer including a hole injection layer, a hole transport layer, a light emitting layer, an electron transport layer and an electron injection layer laminated in this order; and a second electrode facing the first electrode such that the organic common layer is interposed between the second electrode and the first electrode, wherein the hole injection layer comprises a mixture of an inorganic material comprising at the least of one of an alkali metal oxide, an alkaline earth metal oxide, a halogen compound of an alkali metal, a halogen compound of an alkaline earth metal, and an organic material comprising at least one of compounds represented by Formula 1:

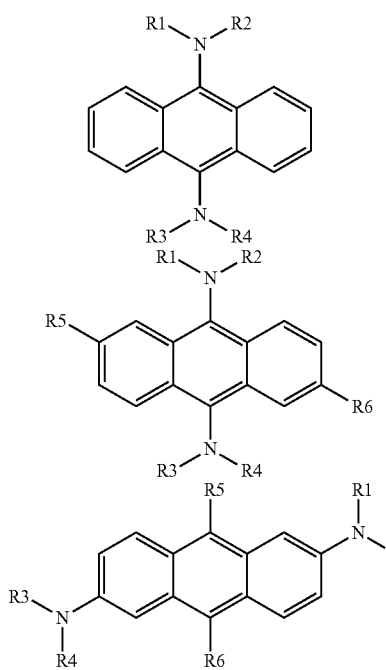

(1)

wherein R1, R2, R3, R4, R5 and R6 are each independently selected from a substituted or unsubstituted $C_6$ to $C_{30}$ aromatic group and a $C_5$ to $C_{29}$ heterocyclic group containing N, S, or O, wherein the substituent is selected from a $C_1$ to $C_6$ aliphatic group and a $C_6$ to $C_{12}$ aromatic group.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EXEMPLARY EMBODIMENTS

Figure 1:
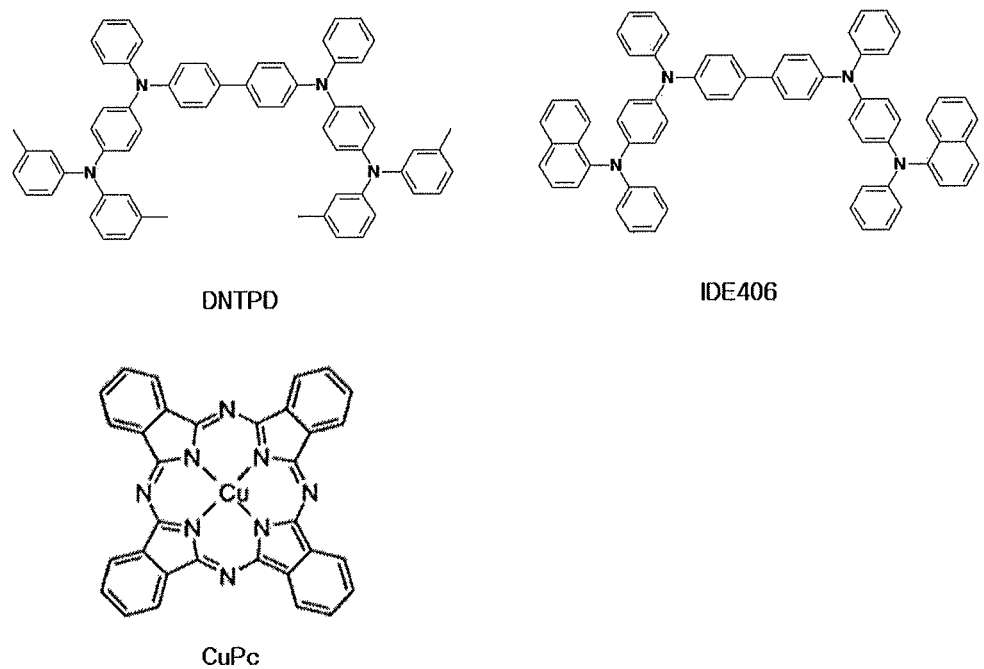
FIG. 1 shows structures of DNTPD, IDE406 and CuPc, compounds used for a conventional hole injection layer.

Hereinafter, preferred embodiments of the present invention will be described with reference to the annexed drawings. Configurations of the present invention, and actions and effects obtained thereby will be clearly understood from the following detailed description. Prior to the detailed description of the present invention, it should be noted that same elements are designated by same reference numerals although they are shown in other drawings, and a detailed description of well-known configuration may be omitted when it is considered to obscure subject matters of the present invention.

Hereinafter, preferred embodiments of the present invention will be described with reference to FIGS. 2 to 6 in detail.

Figure 2:
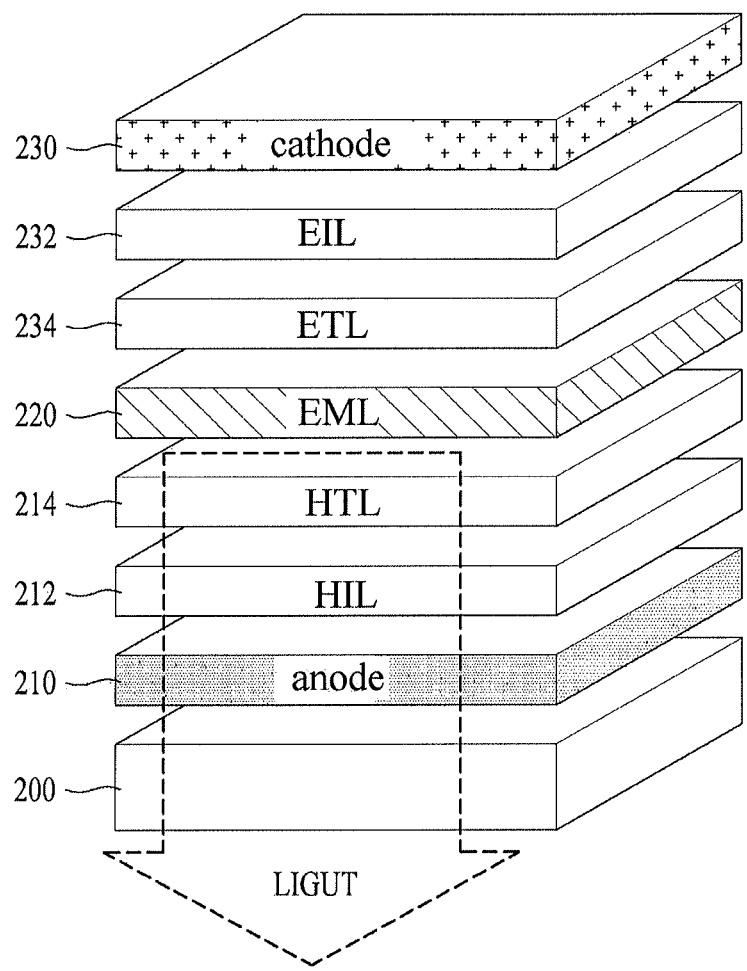
FIG. 2 is a perspective view illustrating an organic light emitting device according to an embodiment of the present invention.
Figure 3:
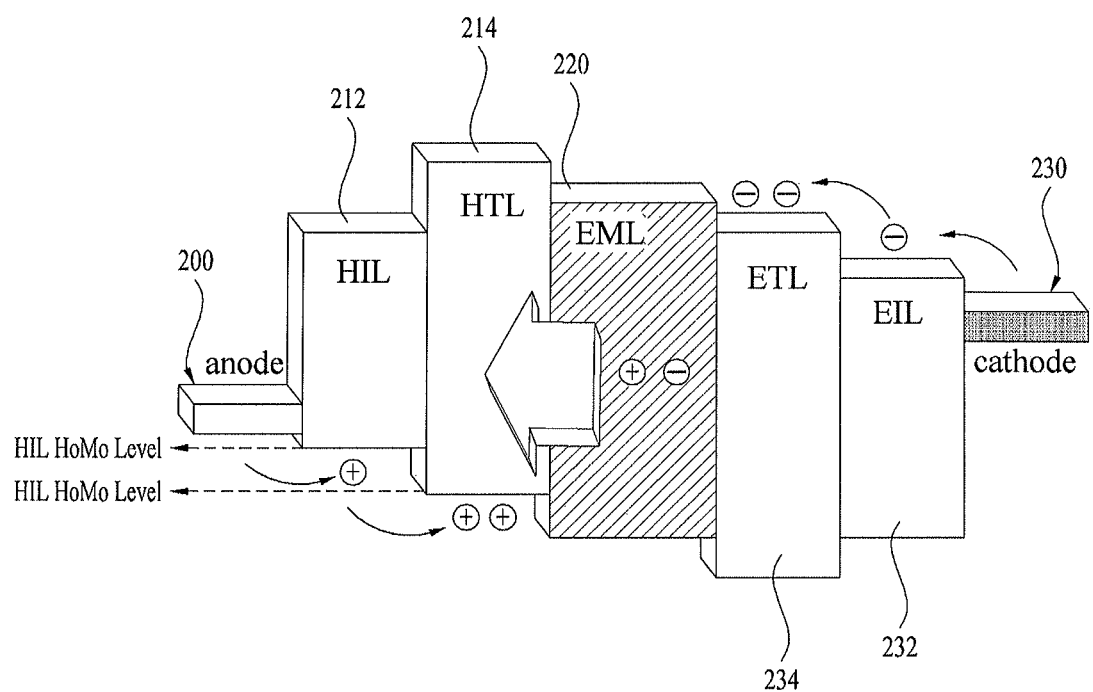
FIG. 3 is a perspective view illustrating a driving principle of the organic light emitting device and a hole injection layer of the present invention shown in FIG. 2.

FIG. 2 is a perspective view illustrating an organic light emitting device according to an embodiment of the present invention, and FIG. 3 a perspective view illustrating a driving principle of the organic light emitting device and a hole injection layer shown in FIG. 2.

Referring to FIGS. 2 and 3, the organic light emitting device according to an embodiment of the present invention has a structure including an anode 210, an organic common layer including a hole injection layer (HIL, 212), a hole transport layer (HTL, 214), a light emitting layer 220, an electron transport layer (ETL, 234), an electron injection layer (EIL, 232), and a cathode 230 laminated in this order on a substrate 200.

In such an organic light emitting device, a voltage is applied between the anode 210 and the cathode 230, holes injected from the anode 210 are recombined with electrons injected from the cathode 230 in the light emitting layer 220 to produce exicitons. Then, the excitons fall to a ground state to emit light toward the rear surface of the device.

The hole injection layer 212 receive holes from the anode 210 and transport the same to the hole transport layer 214, and the hole transport layer 214 receive holes from the hole injection layer 212 and inject and transport the same to the light emitting layer 220. As shown in FIG. 3, in order to facilitate transportation and injection of holes between the hole injection layer 210 and the hole transport layer 214, a difference between a highest occupied molecular orbital (hereinafter, referred to as "HOMO") energy level of the hole injection layer 210 and a HOMO energy level of the hole injection layer 214 should be not large, and interfacial properties between the hole injection layer 212 with the anode 210 should be excellent.

Accordingly, the hole injection layer 212 is formed using a mixture of an inorganic material and an organic material inorganic material and can thus easily inject and transport from the anode 210 to the hole transport layer 214, thus satisfying the conditions. At this time, a mix ratio of the inorganic material and the organic material is about 10:1 to about 1:10. For example, when a mix ratio of the inorganic material and the organic material is 10:1, the inorganic material may be 1 and the organic material may be 0.1. Also, the hole injection layer 212 is formed to have a thickness of about 10 Å to about 200 Å. The inorganic material may be at least one selected from an alkali metal oxide, an alkaline earth metal oxide, a halogen compound of an alkali metal, a halogen compound of an alkaline earth metal. In the alkali metal oxide or the alkali earth metal oxide, the metal may be at least one selected from Li, Na, K, Rb, Cs, Be, Mg, Ca, Sr and Ba.

In the halogen compound of alkali metal or the halogen compound of alkaline earth metal, a central metal is at least one selected from Li, Na, K, Rb, Cs, Be, Mg, Ca, Sr and Ba, and the halogen is at least one selected from F, Cl, Br, and I.

The organic material comprises at least one of compounds represented by Formula 1.

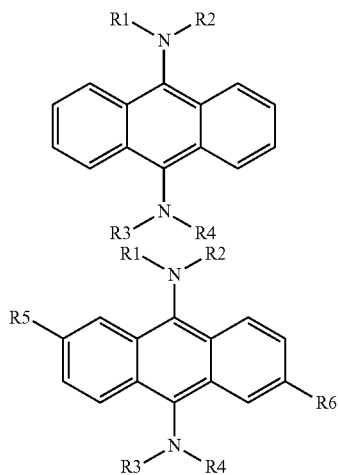

(1)

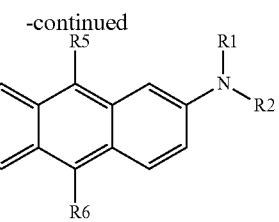

wherein R1, R2, R3, R4, R5 and R6 are each independently selected from a substituted or unsubstituted $C_6$ to $C_{30}$ aromatic group and a $C_5$ to $C_{29}$ heterocyclic group containing N, S, or O, wherein the substituent is selected from a $C_1$ to $C_6$ aliphatic group and a $C_6$ to $C_{12}$ aromatic group. The substituent of the substituted $C_6$ to $C_{30}$ aromatic group is at least one $C_1$ to $C_6$ aliphatic group selected from methyl, ethyl, propyl, butyl and hexyl, and the substituted $C_6$ to $C_{12}$ aromatic group is at least one selected from phenyl, biphenyl, naphthyl and terphenyl. The unsubstituted $C_6$ to $C_{30}$ aromatic group is at least one selected from phenyl, biphenyl, naphthyl, terphenyl, anthracene, phenanthrene, pyrene, and fluoranthene.

Specific examples of the compound of Formula 1 are as follows.

HM-01

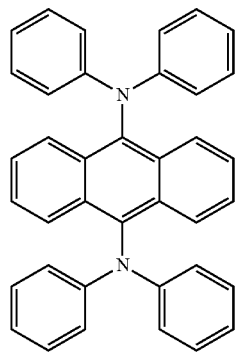

HM-02

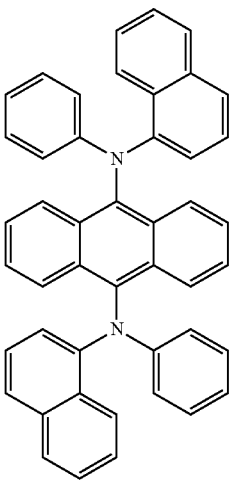

HM-03

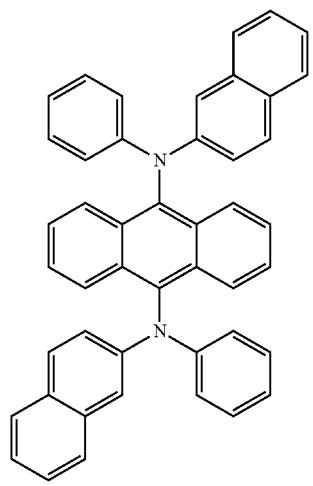

H-04

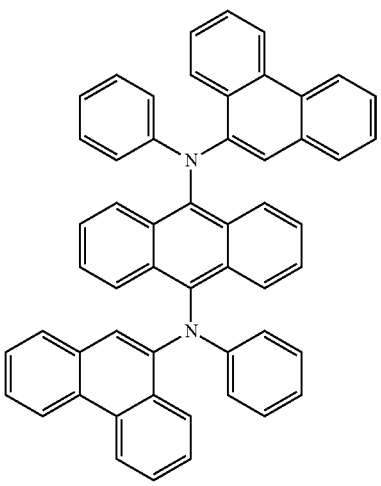

-continued
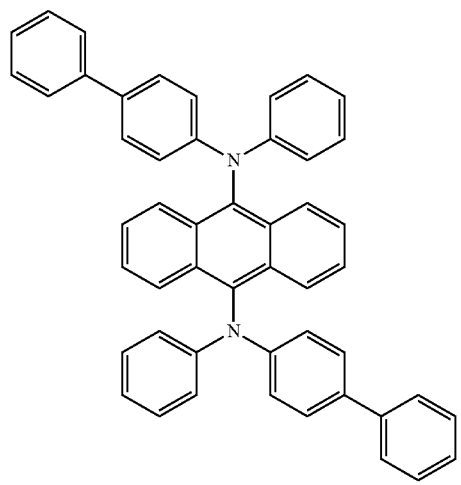
HM-05
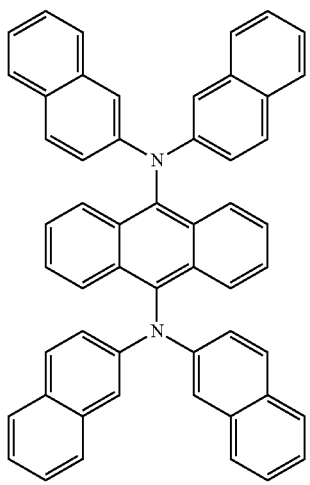
HM-06
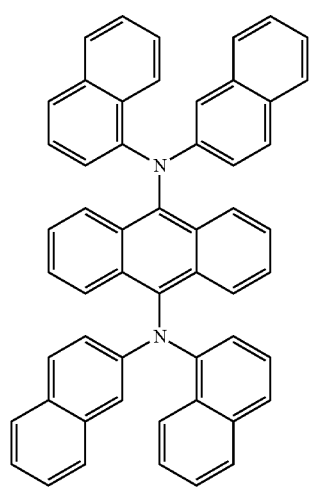
HM-07
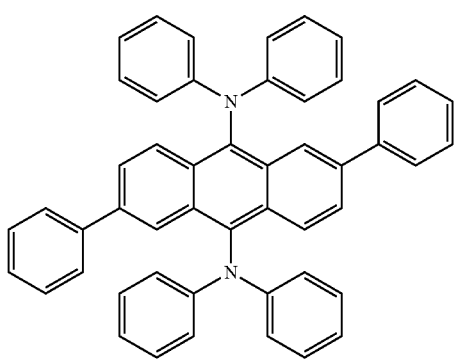
HM-08
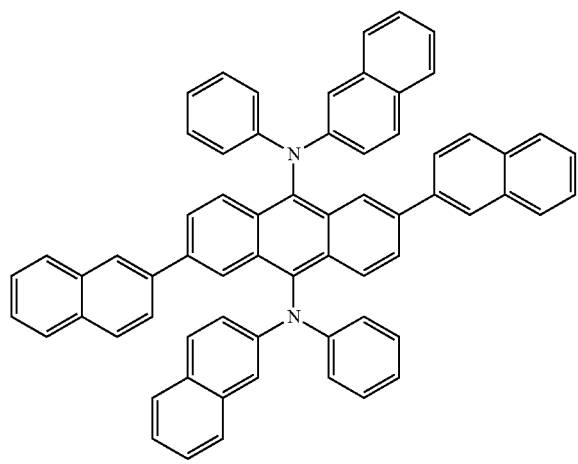
HM-09
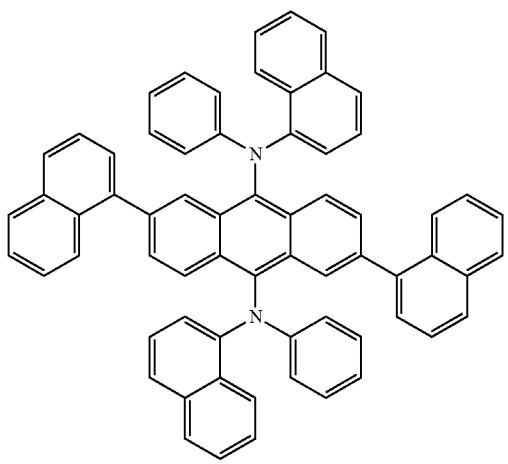
HM-10

-continued
HM-11
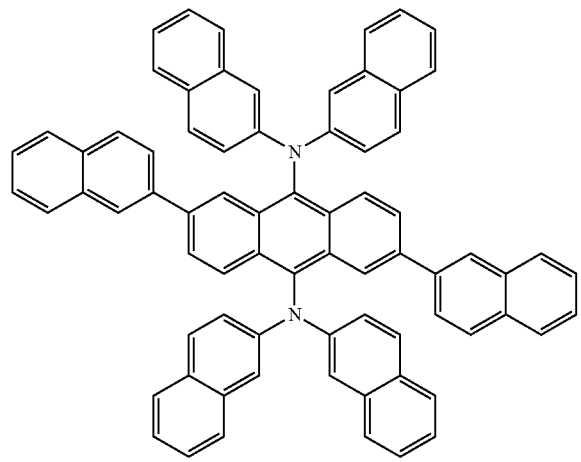
HM-12
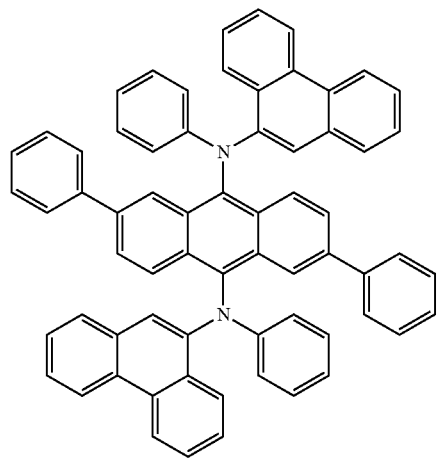
HM-13
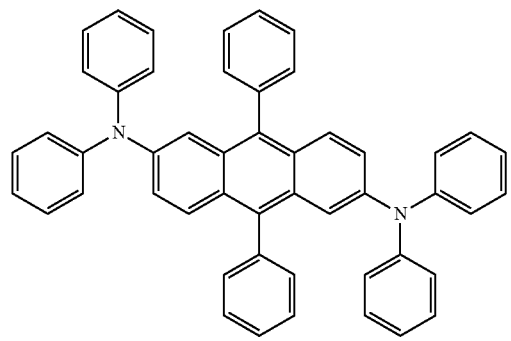
HM-14
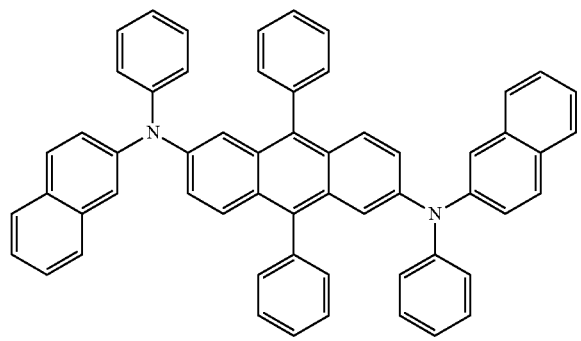
HM-15
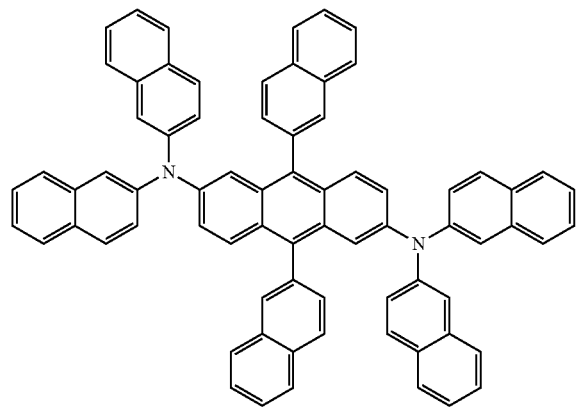
HM-16
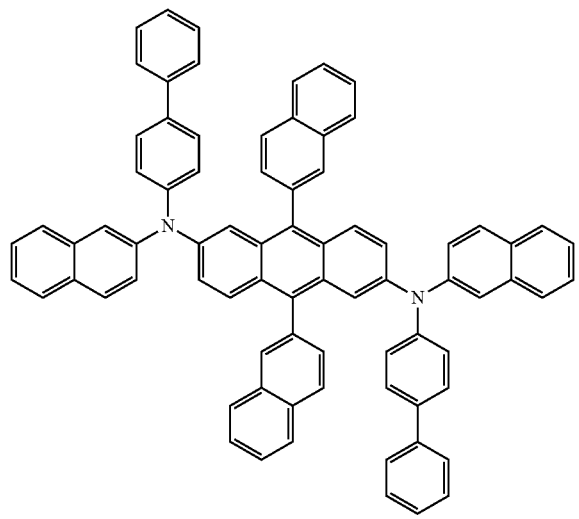

-continued
HM-17
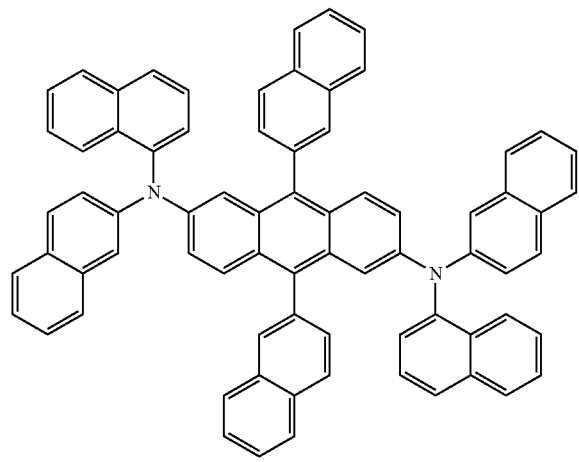
HM-18
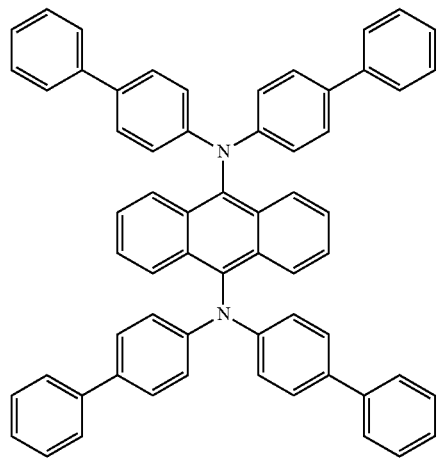
HM-19
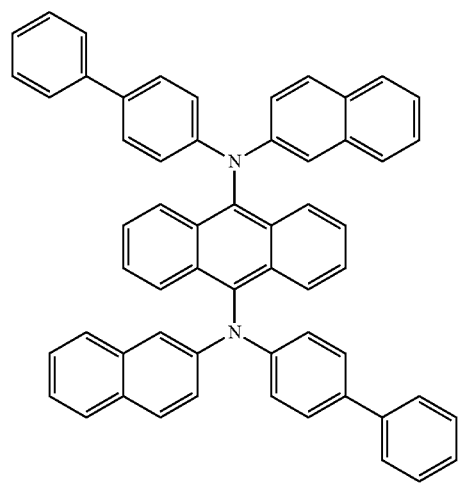
HM-20
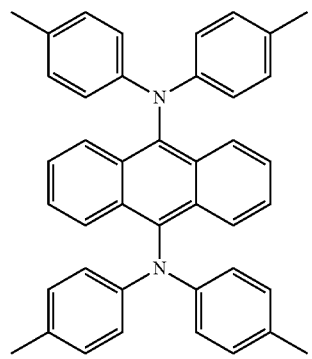
HM-21
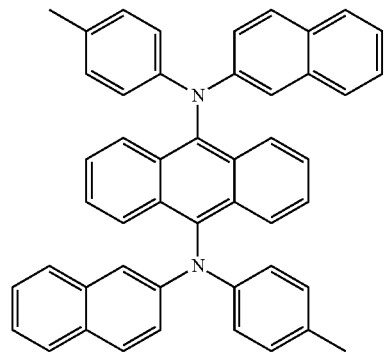
HM-22
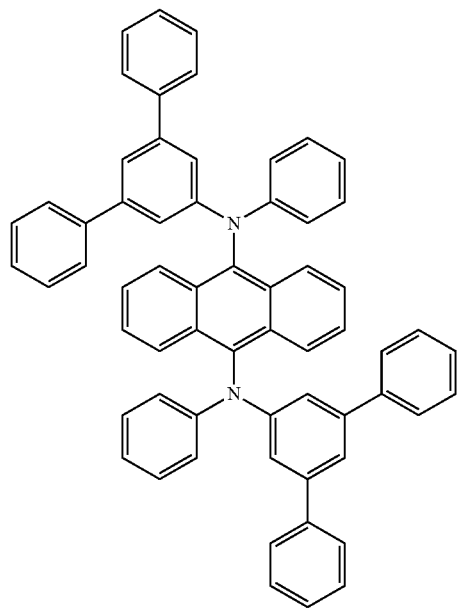

-continued
HM-23
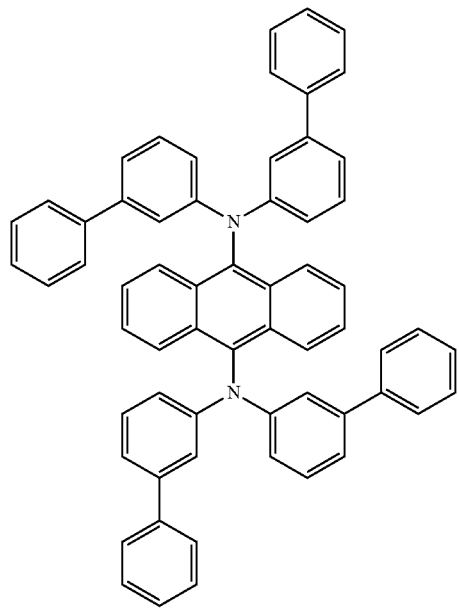
HM-24
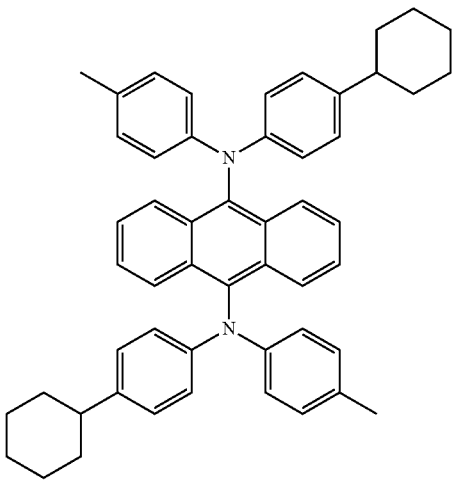
HM-25
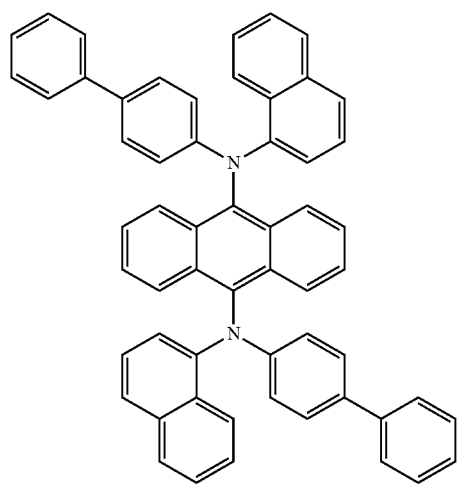
HM-26
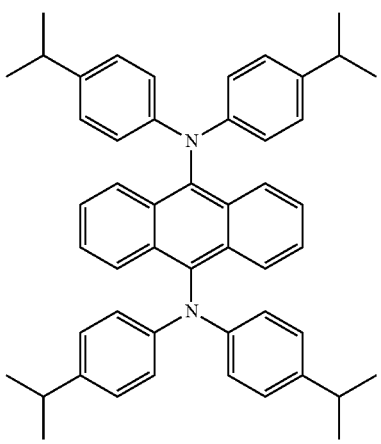

-continued
HM-27
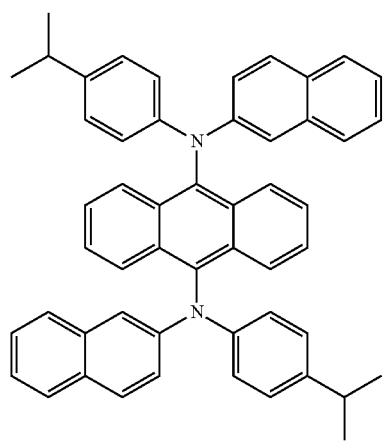
HM-28
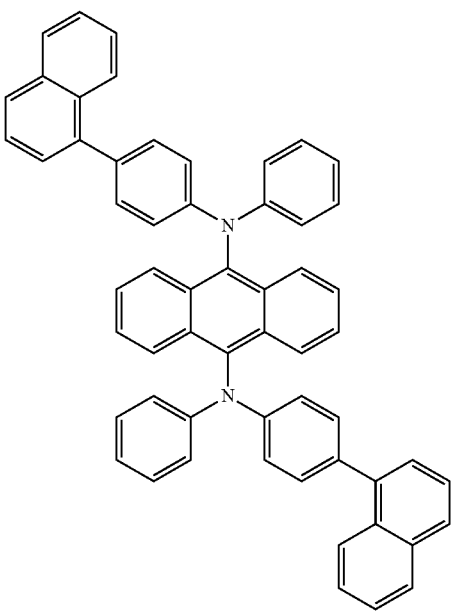
HM-29
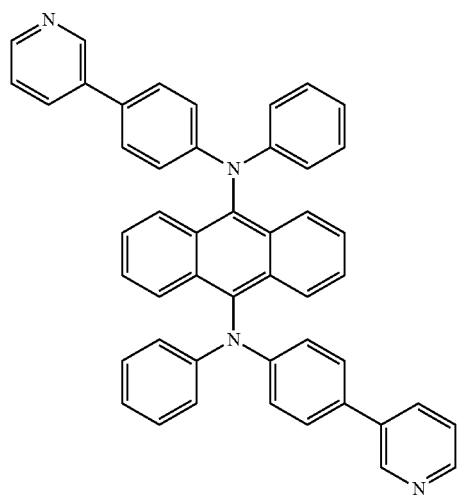
HM-30
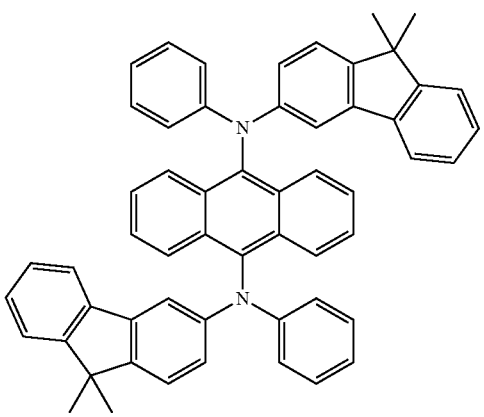
HM-31
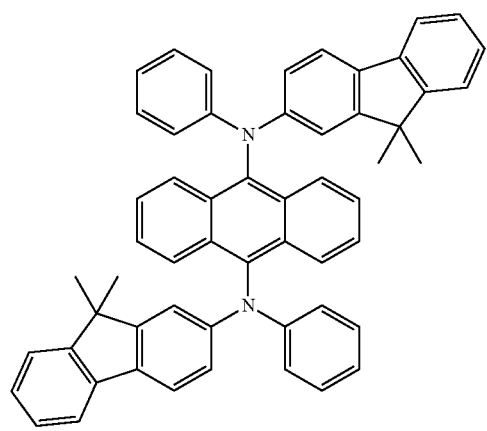
HM-32
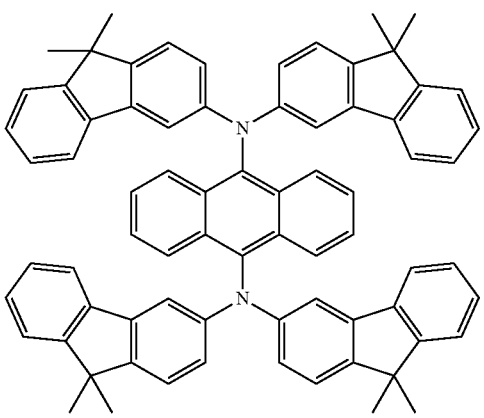

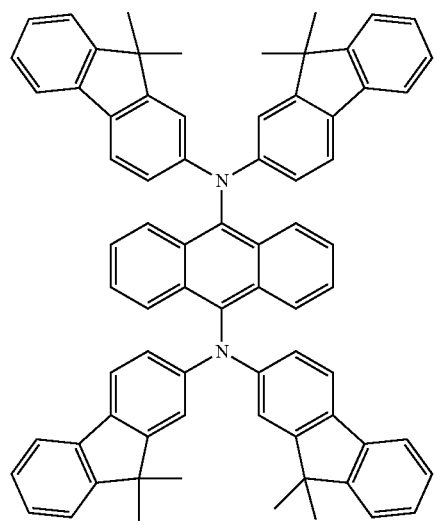
HM-33
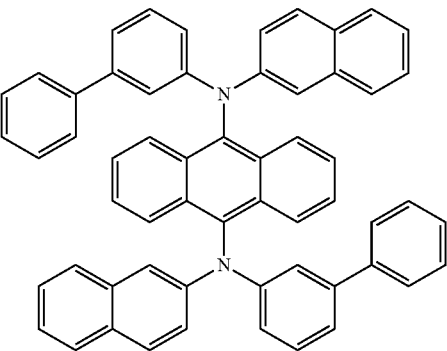
HM-34
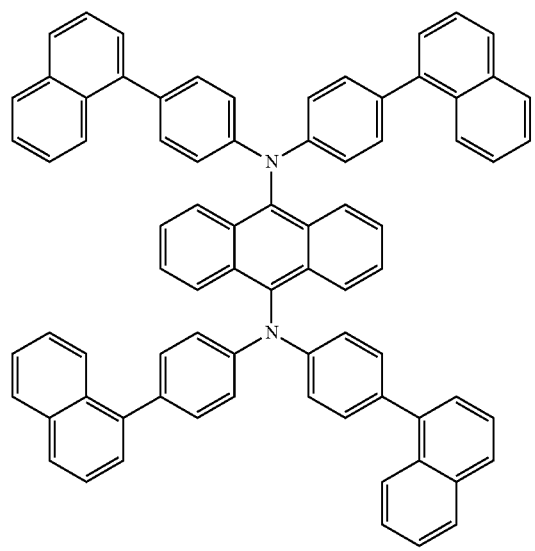
HM-35

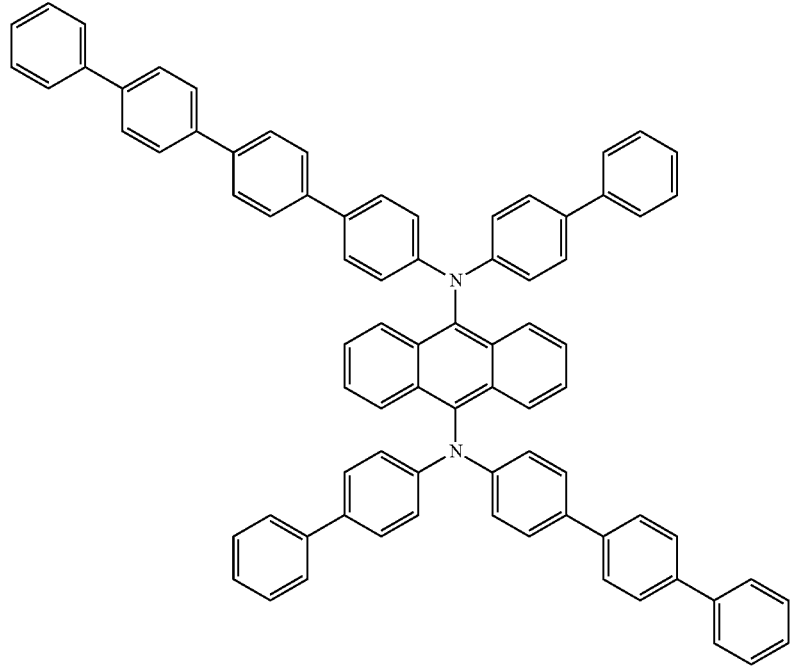
HM-36
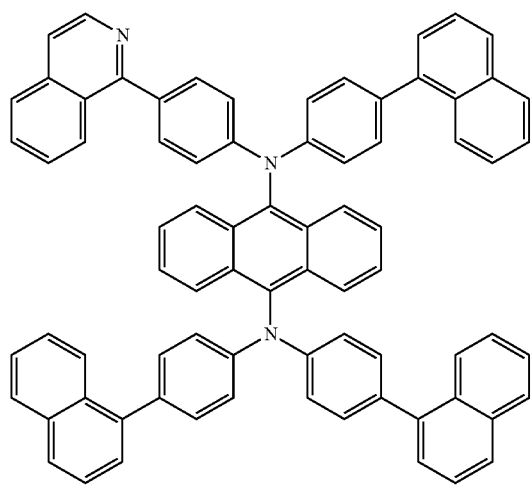
HM-41
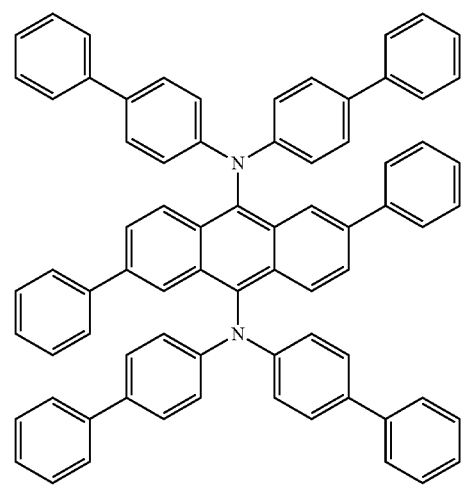
HM-42
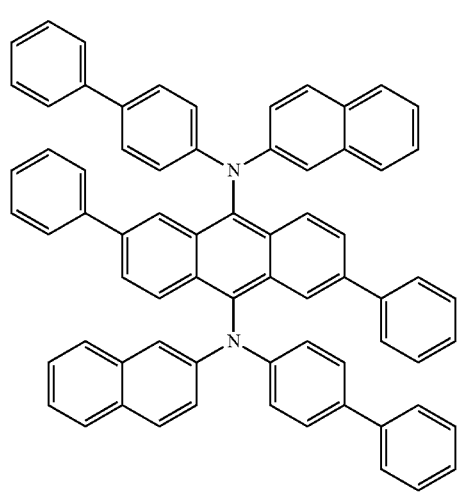
HM-43
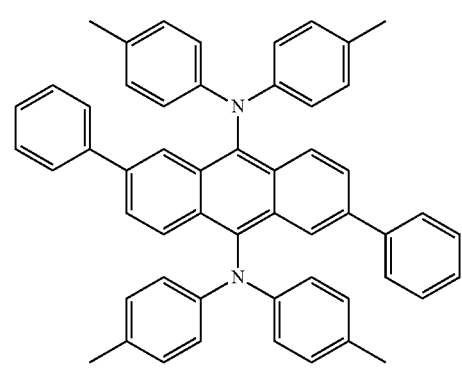
HM-44

-continued
HM-45
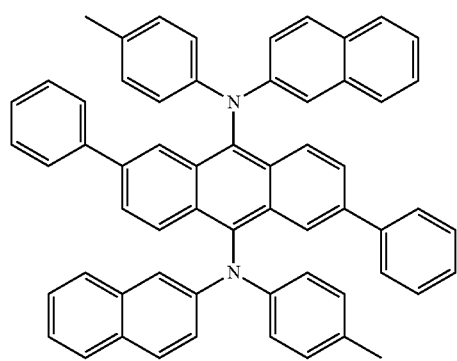
HM-46
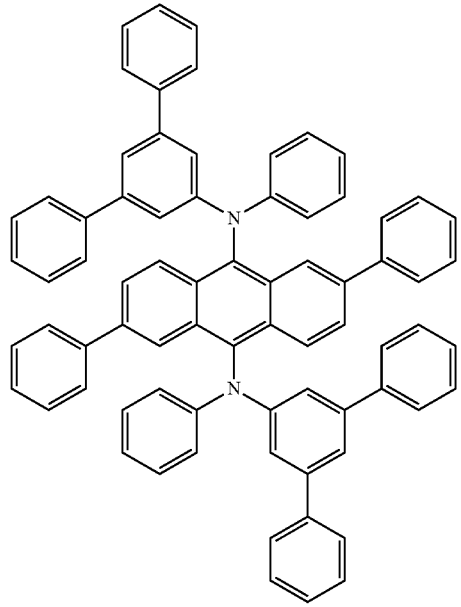
HM-47
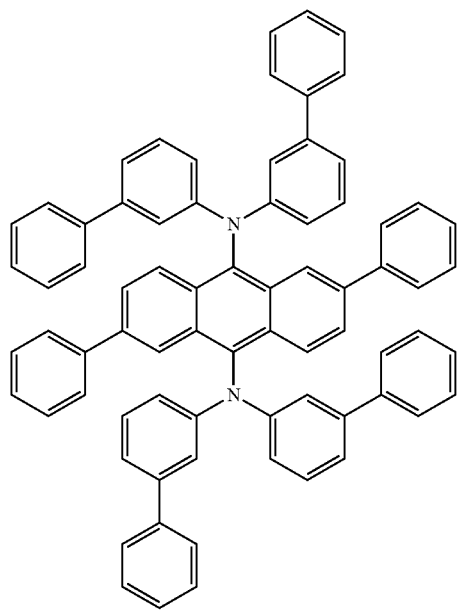
HM-48
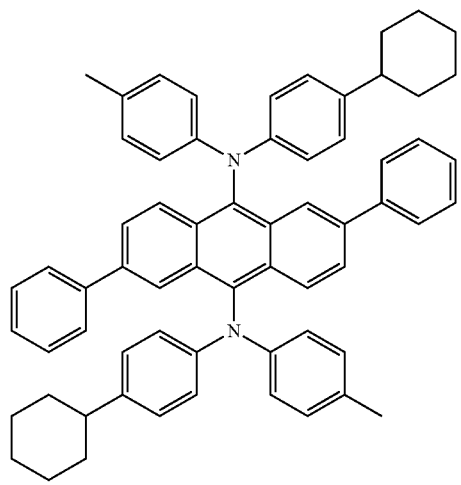

-continued
HM-49
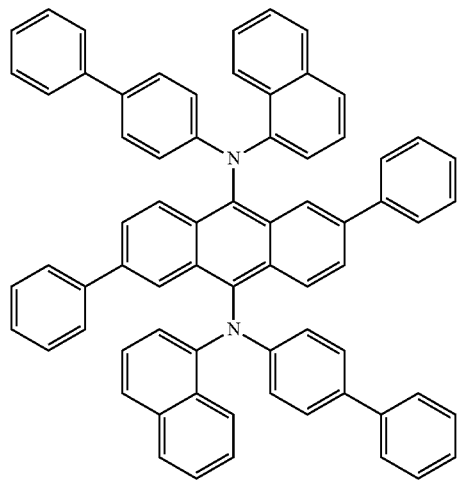
HM-50
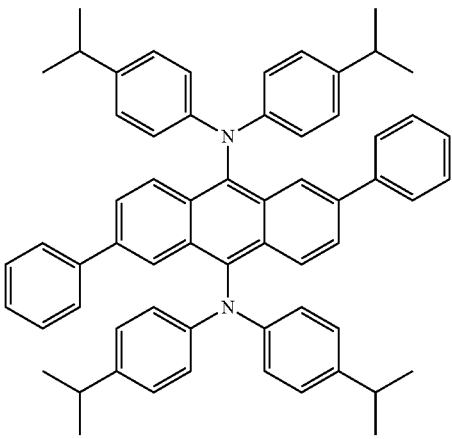
HM-51
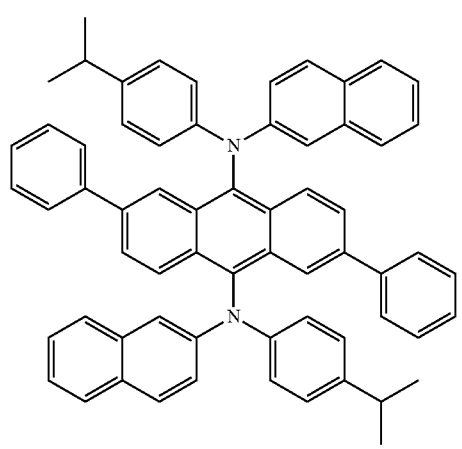
HM-52
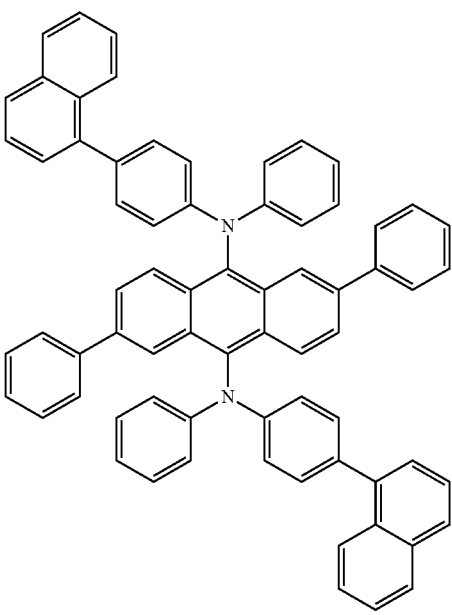
HM-53
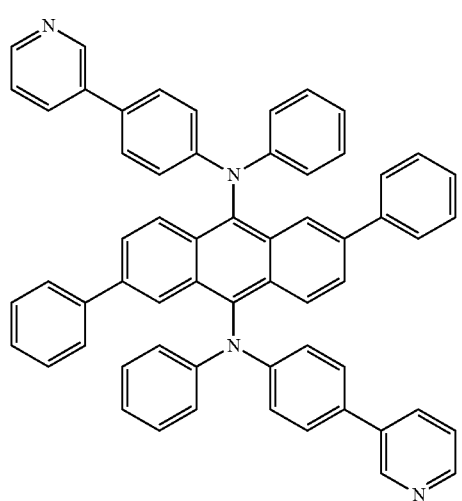
HM-53
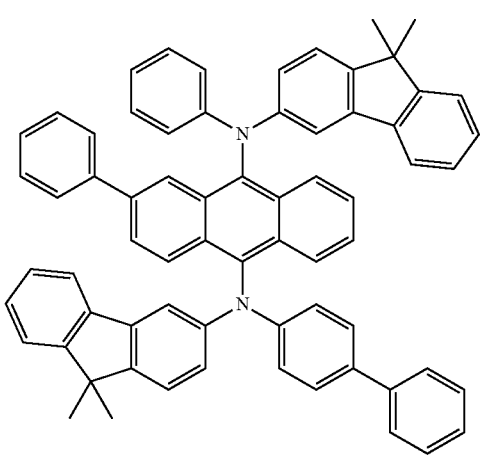

-continued
HM-57
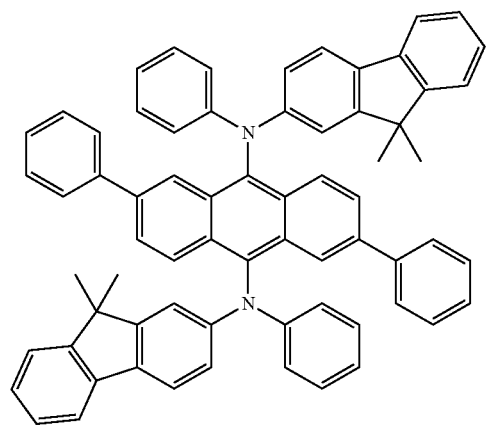
HM-58
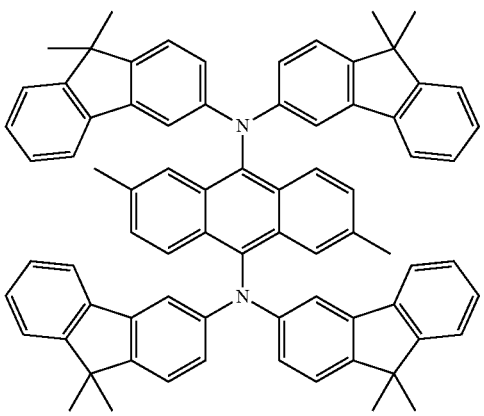
HM-59
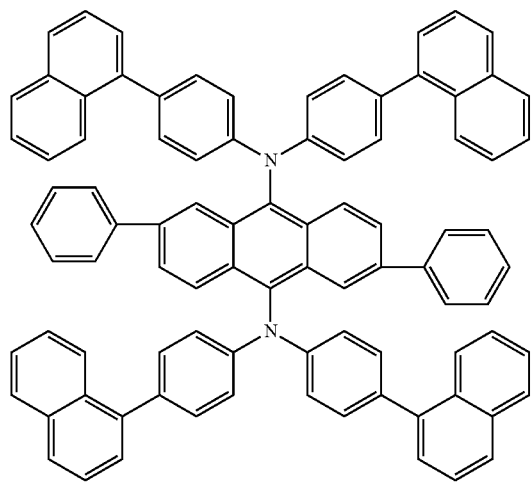
HM-60
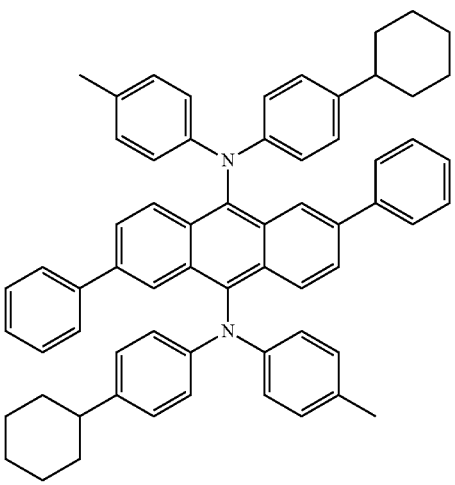
HM-61
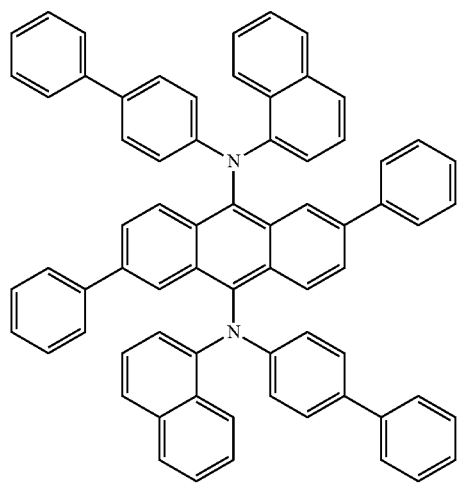
HM-62
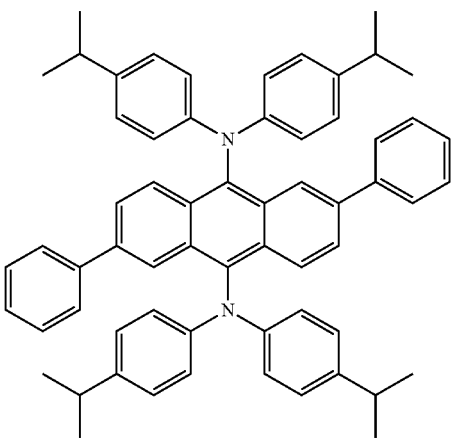

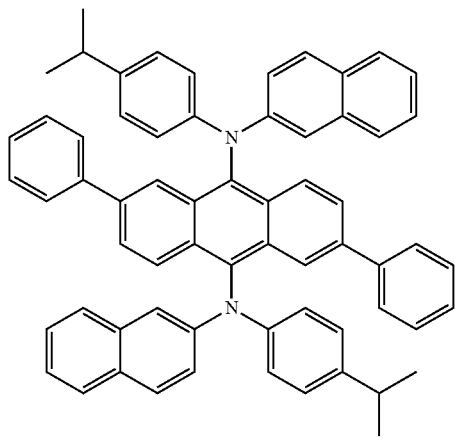

HM-63

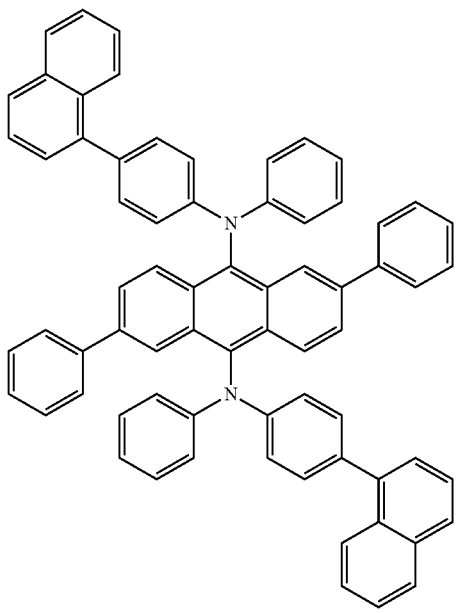

HM-64

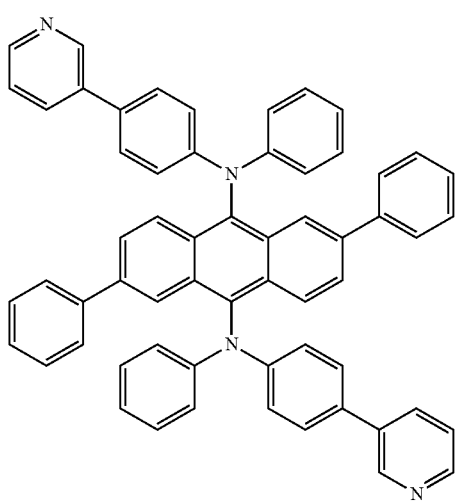

HM-65

Figure 4:
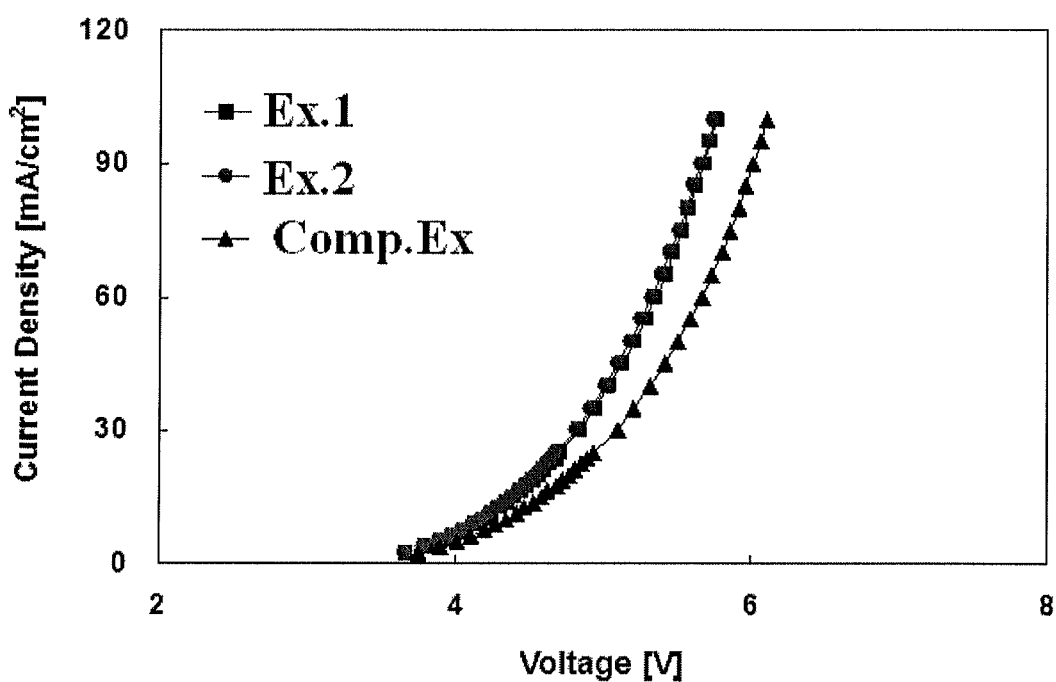
FIGS. 4 and 5 are a graph showing a driving voltage of the organic light emitting device according to the present invention and a driving voltage of the organic light emitting device in Comparative Example.
Figure 5:
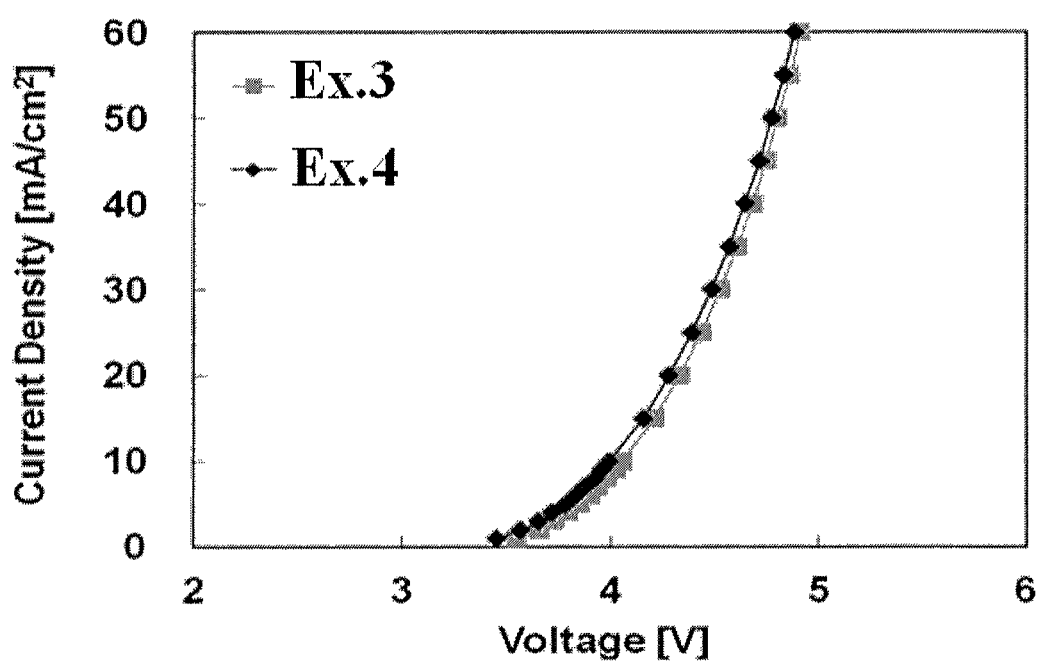

FIGS. 4 and 5 are a graph showing a driving voltage of the organic light emitting device according to the present invention and a driving voltage of the organic light emitting device in Comparative Example. The driving voltage of the organic light emitting device according to the present invention will be described in conjunction with FIGS. 4, 5 and Table 1.

The organic light emitting device according to Comparative Example as set forth in Table 1 uses, as a material for the hole injection layer, a mixture of an organic material and an inorganic material at a ratio of 1:3. The organic material comprises NPD and the inorganic material comprises $MgF_2$. Also, the organic light emitting device according to Example 1 of the present invention uses, as a material for the hole injection layer, a mixture of an organic material and an inorganic material at a ratio of 1:3. The organic material comprises the HM-03 compound and the inorganic material comprises $MgF_2$. Also, the organic light emitting device according to Example 2 of the present invention uses, as a material for the hole injection layer, a mixture of an organic material and an inorganic material at a ratio of 1:5. The organic material comprises a compound of HM-03 and the inorganic material comprises $MgF_2$. And, the organic light emitting device according to Example 3 of the present invention uses, as a material for the hole injection layer, a mixture of an organic material and an inorganic material at a ratio of 1:3. The organic material comprises a compound of HM-18 and the inorganic material comprises $MgF_2$. the organic light emitting device according to Example 4 of the present invention uses, as a material for the hole injection layer, a mixture of an organic material and an inorganic material at a ratio of 1:5. The organic material comprises a compound of HM-18 and the inorganic material comprises $MgF_2$.

TABLE 1

| | Hole injection layer | | | | | | |
|---|---|---|---|---|---|---|---|
| | Organic material | Inorganic material | Volume ratio | Current density (mA/cm$^2$) | Driving voltage (V) | EQE (%) | CIE (xy) |
| Ex. 1 | HM-03 | MgF$_2$ | 1:3 | 10 | 4.2 | 9.1 | 0.137 0.087 |
| Ex. 2 | HM-03 | MgF$_2$ | 1:5 | 10 | 4.2 | 9.0 | 0.137 0.087 |
| Ex. 3 | HM-18 | MgF$_2$ | 1:3 | 10 | 3.9 | 10.2 | 0.138 0.084 |
| Ex. 4 | HM-18 | MgF$_2$ | 1:5 | 10 | 4.0 | 10.1 | 0.137 0.087 |
| Comp. Ex. | NPD | MgF$_2$ | 1:3 | 10 | 4.34 | 9.0 | 0.137 0.086 |

As can be seen from Table 1, FIGS. 4 and 5, the organic light emitting device according to the present invention exhibited a decrease in driving voltage at a current of 10 mA/cm$^2$. This means that interface properties between the hole injection layer and the anode are improved, a difference between the HOMO energy level of the hole injection layer and the HOMO energy level of the hole transport layer is reduced and driving voltage is thus reduced, by forming the hole injection layer with a mixture of an inorganic material and an organic material.

Figure 6:
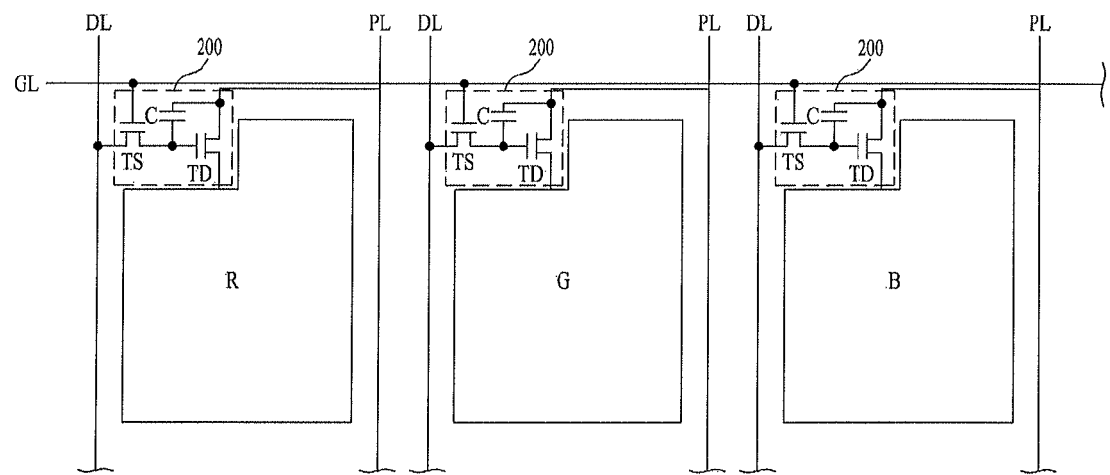
FIG. 6 is a view illustrating equivalent circuits of R, G and B sub-pixel regions according to the present invention.
Figure 7:
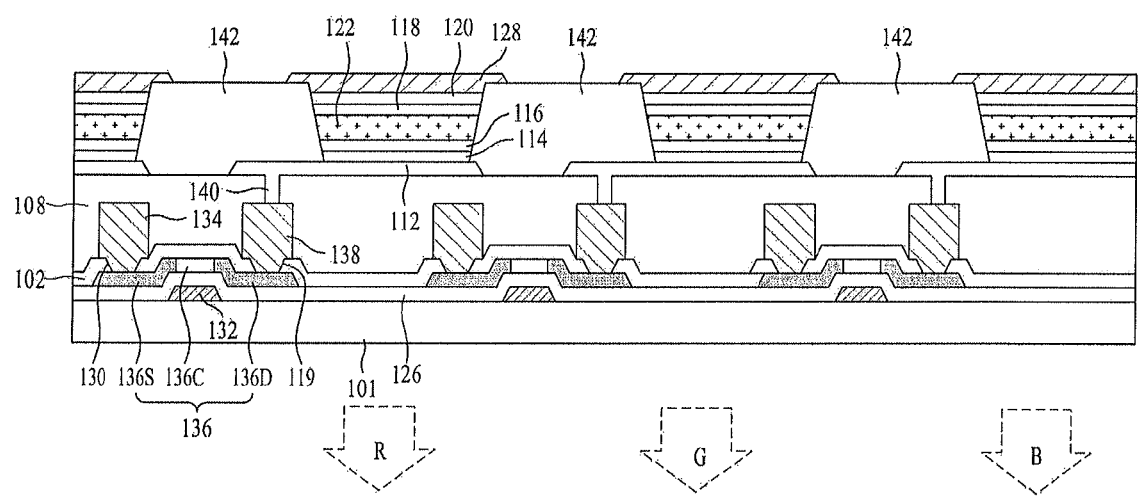
FIG. 7 is a vertical cross-sectional view illustrating R, G, and B sub-pixel regions shown in FIG. 6.

FIG. 6 is a view illustrating equivalent circuits of R, G and B sub-pixel regions according to the present invention and FIG. 7 is a vertical cross-sectional view illustrating R, G, and B sub-pixel regions shown in FIG. 6.

Referring to FIG. 6, a display panel using the organic light emitting device according to an embodiment of the present invention includes R, G, and B sub-pixel regions defined by intersection of a plurality of gate lines (GL), a plurality of data lines (DL) and a plurality of power lines (PL). The R, G and B sub-pixel regions are arrayed in the form of a matrix to display an image.

Each of R, G, and B sub-pixel regions includes a cell driver 200 and an organic light emitting device connected to the cell driver 200.

The cell driver 200 includes a switch thin film transistor (TS) connected to the gate lines (GL) and the data lines (DL), a driving thin film transistor (TD) connected to the switch thin film transistor (TS) and power lines (PL) and a first electrode 122 of the organic light emitting device, and a storage capacitor (C) connected to the power line (PL) and a drain electrode 110 of the switch thin film transistor (TS).

The gate electrode of the switch thin film transistor (TS) is connected to the gate line (GL), the source electrode is connected to the data line (DL), and the drain electrode is connected to the gate electrode of the driving thin film transistor (TD) and the storage capacitor (C). The source electrode of the driving thin film transistor (TD) is connected to the power line (PL) and the drain electrode 110 is connected to the first electrode 122. The storage capacitor (C) is connected to the power line (PL) and the gate electrode of the driving thin film transistor (TD).

The switch thin film transistor (TS) turns on and supplies a data signal supplied to the data line (DL) to the storage capacitor (C) and the gate electrode of the driving thin film transistor (TD), when a scan pulse is applied to the gate line (GL). In response to the data signal supplied to the gate electrode, the driving thin film transistor (TD) controls a current (I) supplied from the power line (PL) to the organic light emitting device, thereby controlling light emission of the organic light emitting device. Also, although the switch thin film transistor (TS) turns off, the driving thin film transistor (TD) supplies a predetermined current (I) due to voltage charged in the storage capacitor (C), until a data signal of the next frame is supplied, to maintain light emission of the organic light emitting device.

As shown in FIG. 6, the driving thin film transistor (TD) includes a gate electrode 132 formed on an insulating substrate 101, a gate insulating film 126 to cover the gate electrode 132, a semiconductor layer 136 formed on the gate insulating film 126, an interlayer insulating film 122 to cover the semiconductor layer 136, and a source electrode 134 and a drain electrode 138 connected to a source region 136S and a drain region 136D of the semiconductor layer 136, respectively, through first and second contact holes 130 and 119 that pass through the interlayer insulating film 102. The semiconductor layer 136 is formed of a LTPS thin film and includes a channel region 136C that overlaps the gate electrode 132, and a source region 136S and a drain region 136D that do not overlap the gate electrode 132 such that the channel region 136C is interposed therebetween, and have injected impurities. Although an embodiment in which the semiconductor layer is formed of an LTPS thin film has been described, the present invention is not limited thereto.

The organic light emitting device (OLED) includes an anode 112 made of a transparent conductive material, formed on a protective film 108 to cover the driving thin film transistor (TD), a bank insulating film 142 provided with a bank hole that exposes the anode 112, organic common layers 114, 116, 118, 120, and 122 formed on the anode 112 exposed through the bank hole, and a cathode 128 formed on the organic common layers 114, 116, 118, 120, and 122.

The organic common layer includes a hole injection layer (HIL, 114), a hole transport layer (HTL, 116), a light emitting layer (122), an electron transport layer (ETL, 118), and an electron injection layer (EIL, 120).

The hole injection layer 120 comprises a mixture of an inorganic material and an organic material, thus satisfying the conditions and thereby easily injection holes from the anode 112 to the hole transport layer 116. A mix ratio of the inorganic material and the organic material is 10:1 to 1:10 and the hole injection layer 120 has a thickness of 10Å to 200Å. The inorganic material may be at least one selected from an alkali metal oxide, an alkaline earth metal oxide, a halogen compound of an alkali metal, and a halogen compound of an alkaline earth metal. In the alkali metal oxide or the alkaline earth metal oxide, the metal may be at least one selected from Li, Na, K, Rb, Cs, Be, Mg, Ca, Sr and Ba. In the halogen compound of alkali metal or the halogen compound of alkaline earth metal, a central metal is at least one selected from Li, Na, K, Rb, Cs, Be, Mg, Ca, Sr and Ba, and the halogen is at least one selected from F, Cl, Br, and I.

Also, the organic material comprises at the least one of compounds represented by Formula 1 above, and R1, R2, R3, R4, R5, and R6 in Formula 1 are each independently selected from a substituted or unsubstituted $C_6$ to $C_{30}$ aromatic group, and a $C_5$ to $C_{29}$ heterocyclic group containing N, S, or O, wherein the substituent is selected from a $C_1$ to $C_6$ aliphatic group and a $C_6$ to $C_{12}$ aromatic group.

the substituent of the substituted $C_6$ to $C_{30}$ aromatic group is at least one $C_1$ to $C_6$ aliphatic group selected from methyl, ethyl, propyl, butyl and hexyl, and the substituted $C_6$ to $C_{12}$ aromatic group is at least one selected from phenyl, biphenyl, naphthyl and terphenyl.

The unsubstituted $C_6$ to $C_{30}$ aromatic group is at least one selected from phenyl, biphenyl, naphthyl, terphenyl, anthracene, phenanthrene, pyrene, and fluoranthene.

Also, specific examples of the compound of Formula 1 are described above and a description thereof is thus omitted.

As apparent from the afore-going, the present invention provides an organic light emitting device that reduces a driving voltage by forming the hole injection layer with a mixture of an inorganic material comprising an oxide of an alkali metal and an alkaline earth metal, or a halogen compound of an alkali metal or an alkaline earth metal, and an organic material comprising at least one of compounds represented by Formula 1.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device comprising an anode, a hole injection layer, a hole transport layer, a light emitting layer, an electron transport layer, an electron injection layer and a cathode laminated in this order,
   wherein the hole injection layer comprises a mixture of an inorganic material comprising at the least of one of an alkali metal oxide, an alkaline earth metal oxide, a halogen compound of an alkali metal, and a halogen compound of an alkaline earth metal, and an organic material comprising at least one of compounds represented by Formula 1:

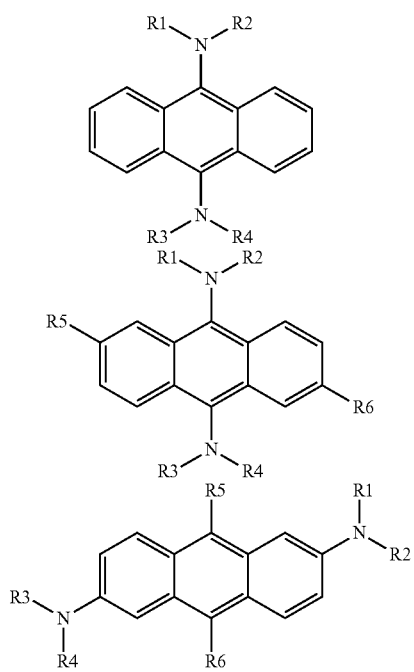

(1)

wherein R1, R2, R3, R4, R5 and R6 are each independently selected from a substituted or unsubstituted $C_6$ to $C_{30}$ aromatic group and a $C_5$ to $C_{29}$ heterocyclic group containing N, S, or O, wherein the substituent is selected from a $C_1$ to $C_6$ aliphatic group and a $C_6$ to $C_{12}$ aromatic group, wherein the substituent of the substituted $C_6$ to $C_{30}$ aromatic group is at least one $C_1$ to $C_6$ aliphatic group selected from methyl, ethyl, propyl, butyl and hexyl, and the substituted $C_6$ to $C_{12}$ aromatic group is at least one selected from phenyl, biphenyl, naphthyl and terphenyl, and wherein the unsubstituted $C_6$ to $C_{30}$ aromatic group is at least one selected from phenyl, biphenyl, naphthyl, terphenyl, anthracene, phenanthrene, pyrene, and fluoranthene.

2. The organic light emitting device according to claim 1, wherein a mix ratio of the inorganic material to the organic material is about 10:1 to about 1:10.

3. The organic light emitting device according to claim 1, wherein the alkali metal oxide or the alkaline earth metal oxide is at least one selected from Li, Na, K, Rb, Cs, Be, Mg, Ca, Sr and Ba.

4. The organic light emitting device according to claim 1, wherein, in the halogen compound of the alkaline metal or the halogen compound of alkali earth metal, a central metal is at least one selected from Li, Na, K, Rb, Cs, Be, Mg, Ca, Sr and Ba, and the halogen is at least one selected from F, Cl, Br and I.

5. A display panel comprising:

a driving thin film transistor formed on a substrate;

an anode connected to the driving thin film transistor;

a bank insulating film provided with a bank hole to expose the anode;

an organic common layer formed in the bank hole, the organic common layer including a hole injection layer, a hole transport layer, a light emitting layer, an electron transport layer and an electron injection layer laminated in this order; and a cathode facing the anode such that the organic common layer is interposed between the cathode and the anode, wherein the hole injection layer comprises a mixture of an inorganic material comprising at the least of one of an alkali metal oxide, an alkaline earth metal oxide, a halogen compound of an alkali metal, and a halogen compound of an alkaline earth metal, and an organic material comprising at least one of compounds represented by Formula 1:

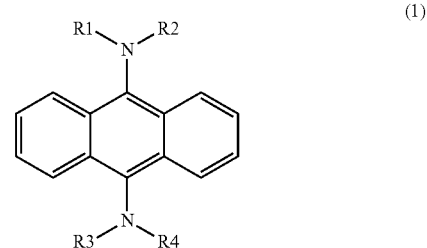

(1)

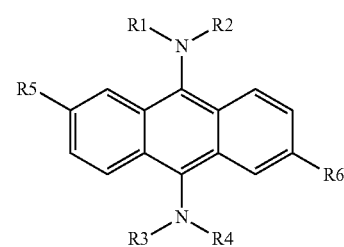

-continued

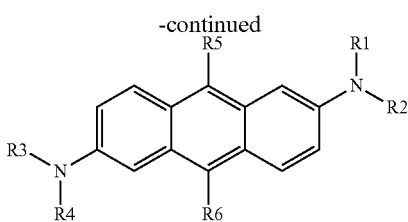

wherein R1, R2, R3, R4, R5 and R6 are each independently selected from a substituted or unsubstituted $C_6$ to $C_{30}$ aromatic group and a $C_5$ to $C_{29}$ heterocyclic group containing N, S, or O, wherein the substituent of the substituted $C_6$ to $C_{30}$ aromatic group is at least one $C_1$ to $C_6$ aliphatic group selected from methyl, ethyl, propyl, butyl and hexyl, and the substituted $C_6$ to $C_{12}$ aromatic group is at least one selected from phenyl, biphenyl, naphthyl and terphenyl, and wherein the unsubstituted $C_6$ to $C_{30}$ aromatic group is at least one selected from phenyl, biphenyl, naphthyl, terphenyl, anthracene, phenanthrene, pyrene, and fluoranthene.

6. The display panel according to claim 5, wherein a mix ratio of the inorganic material to the organic material is about 10:1 to about 1:10.

7. The display panel according to claim 5, wherein the oxide of alkali metal or the oxide of alkali earth metal is at least one selected from Li, Na, K, Rb, Cs, Be, Mg, Ca, Sr and Ba.

8. The display panel according to claim 5, wherein, in the halogen compound of the alkali metal or the halogen compound of alkali earth metal is at least one selected from Li, Na, K, Rb, Cs, Be, Mg, Ca, Sr and Ba, and the halogen is at least one selected from F, Cl, Br and I.

9. The organic light emitting device according to claim 1, wherein R1 and R4 are identical, and R2 and R3 are identical.

10. The display panel according to claim 5, wherein R1 and R4 are identical, and R2 and R3 are identical.

11. An organic light emitting device comprising an anode, a hole injection layer, a hole transport layer, a light emitting layer, an electron transport layer, an electron injection layer and a cathode laminated in this order, wherein the hole injection layer comprises a mixture of an inorganic material comprising at the least of one of a halogen compound of an alkali metal, and a halogen compound of an alkali earth metal, and an organic material comprising at least one of compounds represented by following Formula:

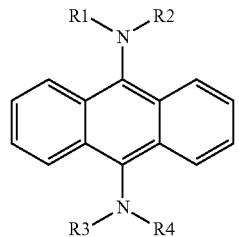

wherein R1, R2, R3 and R4 are each independently selected from a substituted or unsubstituted $C_6$ to $C_{30}$ aromatic group and a $C_5$ to $C_{29}$ heterocyclic group containing N, S, or O, wherein the substituent is selected from a $C_1$ to $C_6$ aliphatic group and a $C_6$ to $C_{12}$ aromatic group.

* * * * *

UNITED STATES PATENT AND TRADEMARK OFFICE
CERTIFICATE OF CORRECTION

PATENT NO.         : 9,136,478 B2
APPLICATION NO.    : 13/650836
DATED              : September 15, 2015
INVENTOR(S)        : Jeong-Dae Seo et al.

Page 1 of 1

It is certified that error appears in the above-identified patent and that said Letters Patent is hereby corrected as shown below:

<u>On the Title Page</u>

Left column, item (54), after "PANEL USING THE SAME", delete "METHOD, TERMINAL, AND SERVER FOR IMPLEMENTING FAST PLAYOUT".

<u>In the Specification</u>

In column 1, lines 2-4 in the title, after "PANEL USING THE SAME", delete "METHOD, TERMINAL, AND SERVER FOR IMPLEMENTING FAST PLAYOUT".

Signed and Sealed this
Twenty-second Day of March, 2016

Michelle K. Lee
*Director of the United States Patent and Trademark Office*